(12) United States Patent
Nogami et al.

(10) Patent No.: US 8,399,350 B2
(45) Date of Patent: Mar. 19, 2013

(54) FORMATION OF AIR GAP WITH PROTECTION OF METAL LINES

(75) Inventors: Takeshi Nogami, Schenectady, NY (US); Shyng-Tsong Chen, Rensselaer, NY (US); David V. Horak, Essex Junction, VT (US); Son V. Nguyen, Schenectady, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 12/700,792

(22) Filed: Feb. 5, 2010

(65) Prior Publication Data

US 2011/0193230 A1 Aug. 11, 2011

(51) Int. Cl.
 *H01L 21/4763* (2006.01)
(52) U.S. Cl. . 438/619; 438/690; 257/773; 257/E21.036; 257/E21.581; 257/E21.037; 257/E21.038
(58) Field of Classification Search ........... 257/E21.581, 257/741, E23.161, E21.585, E23.001, E23.002, 257/E21.023–E21.039, E21.573, E23.151; 438/618, 619, FOR. 495, FOR. 395, 690
See application file for complete search history.

(56) References Cited

U.S. PATENT DOCUMENTS

| | | | | |
|---|---|---|---|---|
| 5,792,706 A | * | 8/1998 | Michael et al. | 438/626 |
| 6,211,561 B1 | * | 4/2001 | Zhao | 257/522 |
| 7,033,926 B2 | * | 4/2006 | Schindler et al. | 438/637 |
| 7,371,684 B2 | | 5/2008 | Colburn et al. | |
| 7,405,147 B2 | * | 7/2008 | Edelstein et al. | 438/618 |
| 7,517,637 B2 | * | 4/2009 | Colburn et al. | 430/311 |
| 8,003,520 B2 | * | 8/2011 | Bonilla et al. | 438/630 |
| 2008/0026541 A1 | | 1/2008 | Edelstein et al. | |
| 2008/0284019 A1 | | 11/2008 | Yang et al. | |
| 2009/0108450 A1 | | 4/2009 | Lloyd, Jr. et al. | |
| 2009/0127711 A1 | | 5/2009 | Bonilla et al. | |
| 2009/0140428 A1 | | 6/2009 | Bonilla et al. | |
| 2009/0152723 A1 | | 6/2009 | Ou et al. | |
| 2009/0278258 A1 | | 11/2009 | Yang et al. | |

* cited by examiner

*Primary Examiner* — Fernando L Toledo
*Assistant Examiner* — Victoria K Hall
(74) *Attorney, Agent, or Firm* — Ira D. Blecker; Katherine S. Brown

(57) ABSTRACT

Method for fabricating a microelectronic element having an air gap in a dielectric layer thereof. A dielectric cap layer can be formed which has a first portion overlying surfaces of metal lines, the first portion extending a first height above a height of a surface of the dielectric layer, and a second portion overlying the dielectric layer surface and extending a second height above the height of the surface of the dielectric layer, the second height being greater than the first height. After forming the cap layer, a mask can be formed over the cap layer. The mask exposes a surface of only the second portion of the cap layer which has the greater height. Subsequently, an etchant can be directed towards the first and second portions of the cap layer. Material can be removed from the dielectric layer where exposed to the etchant.

16 Claims, 5 Drawing Sheets

FORMATION OF AIR GAP WITH PROTECTION OF METAL LINES

BACKGROUND OF THE INVENTION

1. Field of the Invention

The subject matter of the present application relates to microelectronic devices, particularly microelectronic devices having semiconductor devices incorporated therein, and their fabrication. More specifically, the present subject matter relates to microelectronic devices which include an air gap between metal lines therein, and the fabrication thereof.

2. Description of the Related Art

FIG. 1 is a sectional view illustrating a stage in a method of fabricating a microelectronic element 10 such as a semiconductor wafer or semiconductor chip according to the prior art. The prior art fabrication method has application in "Back End Of Line" (BEOL) fabrication of a series of dielectric layer 110 and metal wiring lines 120 therein which support operation of semiconductor devices 102 provided within a semiconductor region 100 of the microelectronic element. Structure (shown generally at 105), which may include dielectric material, semiconductive or conductive features, e.g., vias, lines, etc., typically connects the metal wiring lines 120 with the semiconductor devices 102, although not specifically shown in FIG. 1.

Typically, the metal lines 120 are provided as damascene structures, i.e., inlaid at a surface 115 of the dielectric layer 110, and one or more layers 112 of various conductive or non-conductive materials can line walls of the dielectric layer 110 to promote adhesion thereto, as a barrier to inhibit diffusion of materials, as a seed layer for electroplating a fill metal or for other purposes. A dielectric cap layer 114 may overlie the dielectric layer 110 and the metal wiring lines 120.

As further shown in FIG. 1, a mask layer 116 can overlie the dielectric cap for use in subsequent fabrication steps. The mask layer has a multiplicity of holes aligned with the dielectric layer 110 and with the metal lines 120. The holes in the mask layer 116 can be randomly distributed over the cap layer 114. As a result, the mask holes overlie the metal lines 120 and areas 124 of the dielectric layer between the metal lines 120. A second mask layer 125 which lacks holes can overlie one or more of the metal lines 120' and other areas 126 of the dielectric layer to protect such metal line 120' and areas 126 from subsequent processing.

As illustrated in FIG. 2, a directional etch process, such as a reactive ion etch ("RIE") process, removes portions of the cap dielectric layer 114 and dielectric layer 110 which are aligned with the holes in the mask layer 116 to form recesses 130. Due to the nature of RIE which includes bombardment of ions, surfaces which are exposed during RIE can be eroded. Thus, surfaces of the metal lines 120 which are aligned with the holes in the masking layer can become eroded, leaving recesses 122 therein.

FIG. 3 illustrates a subsequent stage of fabrication in which a post-RIE cleaning process and a further etch process are employed. For example, an isotropic wet etch process can be employed to remove material exposed at the walls and bottoms of the recesses 130 (FIG. 2) in the dielectric layer 110 to form larger recesses 132. Such recesses 132, when they remain occupied by air or other gas after subsequent processing, provide voids between metal lines 120 of the structure.

FIG. 3 further illustrates an effect of the RIE and subsequent etch processes on the metal lines. Exposure of the metal lines 120 to the directional and subsequent isotropic etch processes leaves recesses 122' in the metal lines which typically have uneven and often rough surfaces 128.

SUMMARY OF THE INVENTION

According to an aspect of the invention, a method is provided for fabricating a microelectronic element having an air gap in a dielectric layer thereof. According to such method, a dielectric cap layer can be formed which has a first portion overlying surfaces of metal lines and a second portion overlying a surface of a dielectric layer between the metal lines. The first portion can have a first height above a height of the surface of the dielectric layer, and the second portion can have a second height above the height of the surface of the dielectric layer, the second height being greater than the first height. After forming the cap layer, a mask can be formed over the cap layer. The mask can have a multiplicity of randomly disposed holes. Each hole can expose a surface of only the second portion of the cap layer which has the greater height. The mask may fully cover a surface of the first portion of the cap layer having the lesser height. Subsequently, an etchant can be directed towards the first and second portions of the cap layer to form holes in the cap layer aligned with the holes in the mask. Material can be removed from the dielectric layer where exposed to the etchant by the holes in the cap layer. At such time, the mask can protect the first portion of the cap layer and the metal lines underlying the first portion from being attacked by the etchant.

In one embodiment, the dielectric layer can be an interlevel dielectric ("ILD") layer such as SiCOH or a low-K dielectric material. The cap layer can be a material such as silicon carbide, silicon nitride or a combination thereof.

In one embodiment, the mask can be a di-block layer having a substantially planar surface remote from the cap layer, such that the di-block layer has a first portion overlying the first portion of the cap layer and a second portion overlying the second portion of the cap layer. The first portion of the di-block layer can have a thickness greater than or equal to a critical thickness of the di-block layer, and the second portion of the di-block layer can have a thickness less than a critical thickness. As a result, holes form preferentially in the second portion of the di-block layer which extend to a surface of the cap layer.

A microelectronic element according to an aspect of the invention can include a dielectric layer overlying a semiconductor region of a substrate, and the dielectric layer can have an exposed surface. A plurality of metal lines can consist essentially of a first metal, and each metal line can have edges and a surface extending between the edges and exposed at the surface of the dielectric layer. A dielectric cap layer can have a first portion overlying the surfaces of the metal lines and a second portion overlying the dielectric layer between the metal lines, the first portion having a first height above a height of the surface of the dielectric layer. The second portion can have a second height above a height of the surface of the dielectric layer, wherein the second height is greater than the first height. At least one air gap can be disposed between the metal lines. The air gap can underlie the second portion of the cap layer which has the greater height.

DETAILED DESCRIPTION

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a surface of a metal line or other conductive structure which is exposed at a surface of a dielectric structure may project from such surface; may be flush with such surface; or may be recessed relative to such surface and exposed through a hole or depression in the dielectric.

Figure 1:
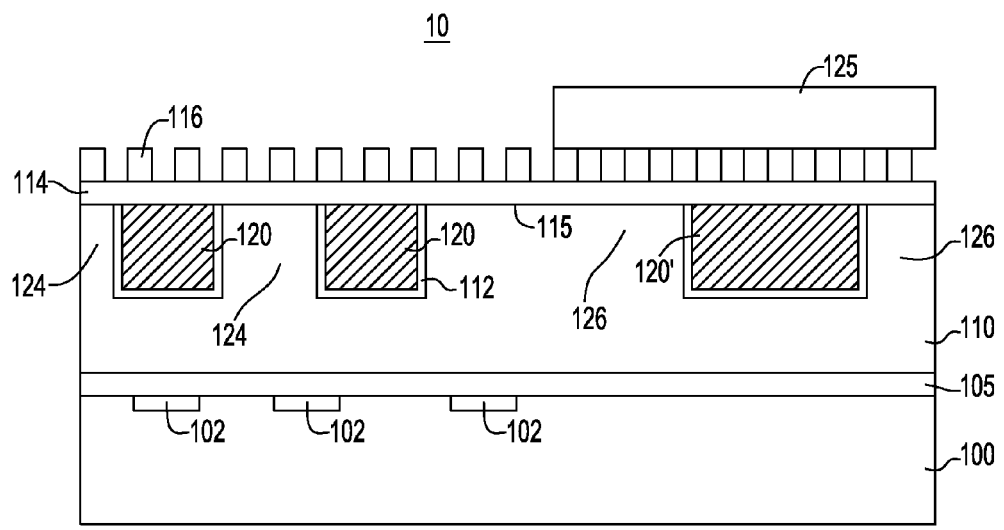
FIG. 1 is a sectional view illustrating a stage in a method of fabricating a microelectronic element in accordance with the prior art.
Figure 2:
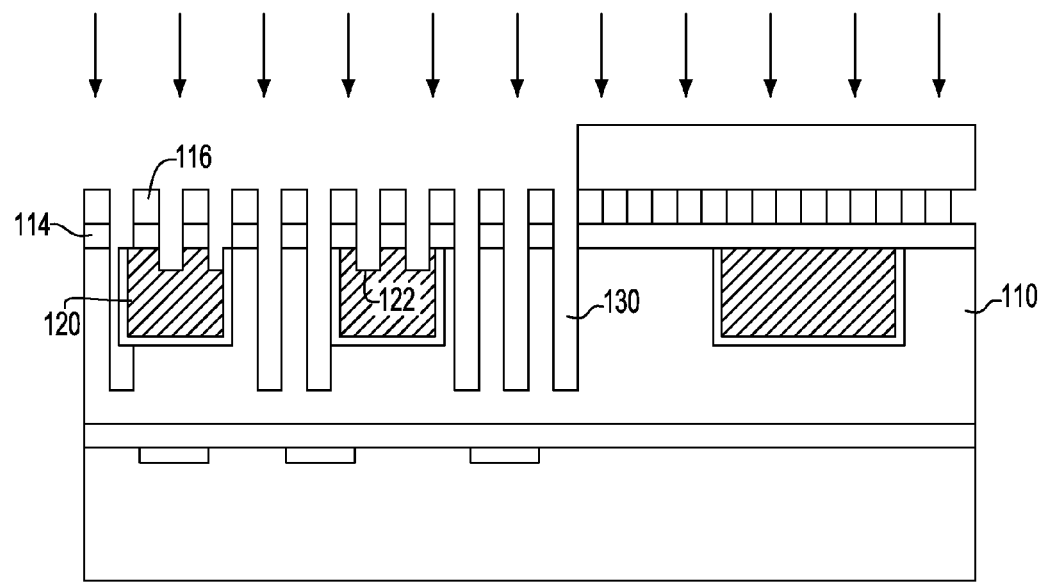
FIG. 2 is a sectional view illustrating a stage in a method of fabricating a microelectronic element subsequent to the stage illustrated in FIG. 1, in accordance with the prior art.
Figure 3:
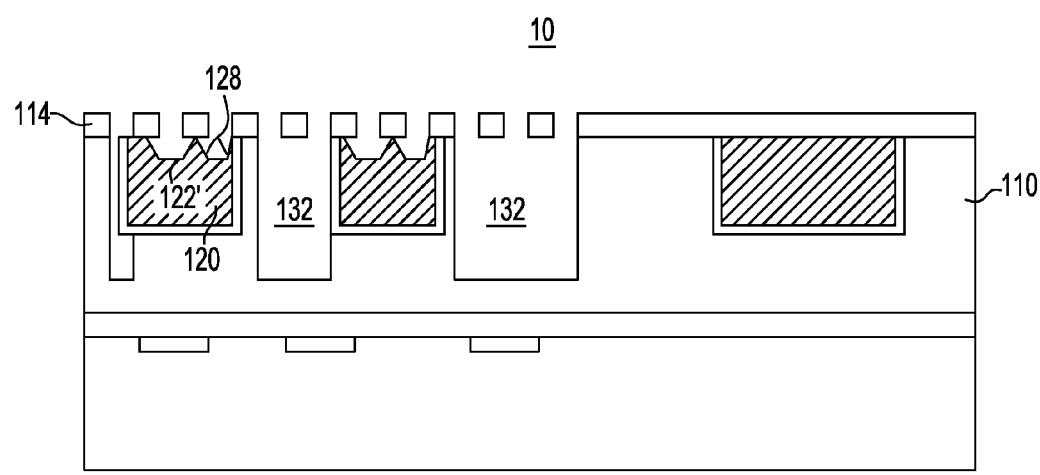
FIG. 3 is a sectional view illustrating a stage in a method of fabricating a microelectronic element subsequent to the stage illustrated in FIG. 2, in accordance with the prior art.

Referring again to FIG. 3, the uneven or rough surfaces 128 of the recesses 122' in the metal lines 120 (FIG. 3) remaining after RIE and subsequent etch processes of the prior art are a byproduct of forming air gaps 132 using the process shown in FIGS. 1 through 3. In subsequent processing or in use of the microelectronic element 10 after fabrication, those surfaces 128 can promote electromigration of the metal outward from the metal lines 120. If not adequately addressed, electromigration can lead to premature failure of the microelectronic element 10.

An embodiment of the invention provides a method of forming air gaps in a dielectric layer between metal lines. The method can reduce the exposure of the metal lines to etch processes used to form the air gaps. In such way, air gaps can be formed in the dielectric layer while employing measures to protect the surfaces of the metal lines from the etch processes.

Accordingly, in one embodiment, metal lines are exposed at a surface of a dielectric layer such as, for example, an interlevel dielectric layer (ILD) or other dielectric layer which can overlie the ILD layer. A dielectric cap layer overlies the surface of the dielectric layer and the metal lines. A mask can be formed which has randomly distributed holes over the dielectric cap layer including over surfaces of the ILD layer between the metal lines. The mask may be free of holes over surfaces of the metal lines. RIE process can then etch holes in the dielectric cap layer and the ILD layer underlying the dielectric cap layer. A subsequent less directional etch process such as a wet etch process can then expand the holes in the ILD layer. In locations over the surfaces of the metal lines where the mask may be free of holes, the mask can protect the metal lines from the etch processes. In this way, the mask allows etch processes to be conducted to form air gaps in the ILD layer between the metal lines while the mask can protect the surfaces of the metal lines from being etched.

Figure 4:
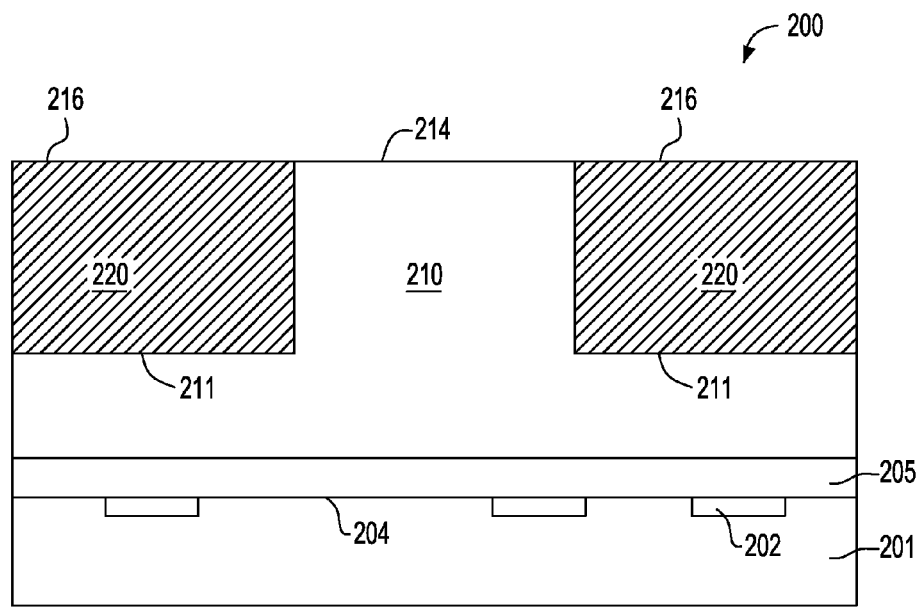
FIG. 4 is a sectional view illustrating a stage in a method of fabricating a microelectronic element in accordance with an embodiment of the invention.

Referring now to FIG. 4, a method will now be described for fabricating a microelectronic element having air gaps between metal lines embedded supported by a dielectric layer such as an ILD layer. As seen in FIG. 4, a microelectronic element 200 such as a wafer or semiconductor chip includes a plurality of semiconductor devices 202 adjacent to a surface 204 of a semiconductor region 201. A plurality of metal lines or metal features 220 (hereinafter, "metal lines") have surfaces 216 exposed at a surface 214 of a dielectric layer 210. The metal lines 220 can be embedded within recesses 211 provided in the dielectric layer 210. The metal lines may include one or more of a variety of metals of metal alloys. In one embodiment, the metal lines consist essentially of copper. As seen in FIG. 4, structure 205, e.g., dielectric material and semiconductive or conductive features such as vias, lines, etc. (not shown) can connect the metal lines 220 with semiconductor devices 202. Unless otherwise noted, such structure 205 shall be assumed present in the drawings representing subsequent fabrication stages herein. The dielectric layer 210 can be an interlevel dielectric (ILD) layer of the microelectronic element 200. The ILD layer typically is silicon dioxide, SiCOH (silicon carbonyl) or a low-K dielectric material, but can be another dielectric material.

Figure 5:
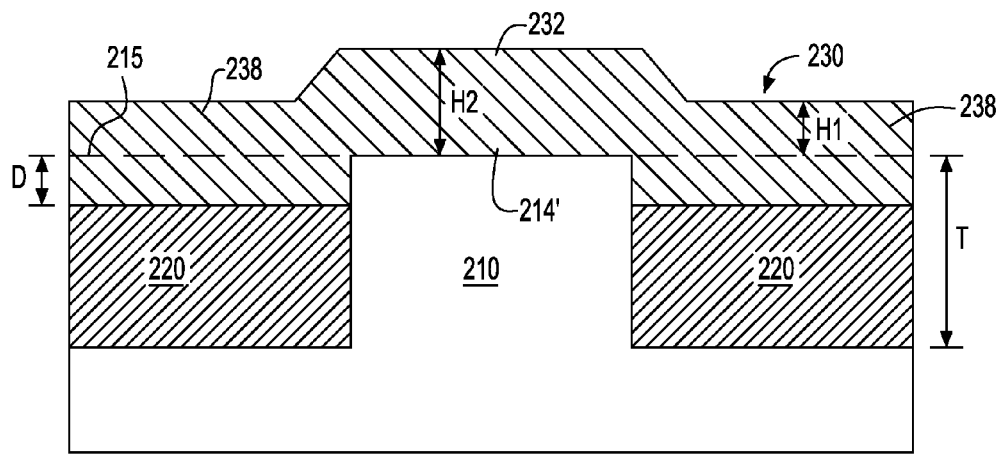
FIG. 5 is a sectional view illustrating a stage in a method of fabricating a microelectronic element subsequent to the stage illustrated in FIG. 4, in accordance with an embodiment of the invention.

FIG. 5 illustrates a subsequent stage in which the metal lines 220 have been recessed a controlled depth D below a height 215 of their original surfaces (216; FIG. 4). An example of a process which can be used to recess the metal lines is described in U.S. Pat. No. 7,064,064 ("the '064 patent"), the disclosure of which is incorporated by reference herein. For example, as described in the '064 patent, the metal lines can be oxidized to the controlled depth D from an exposed surface 216 thereof, and the metal oxide layer can then be removed selectively with respect to a material or layer exposed at surface 214 of the dielectric layer 210. In one embodiment, the depth D can be greater than 100 angstroms, and indeed, can be 200 angstroms or greater. In a particular embodiment, the depth D is controlled such that it does not exceed 25% of an original thickness T of the metal lines 220.

Figure 6:
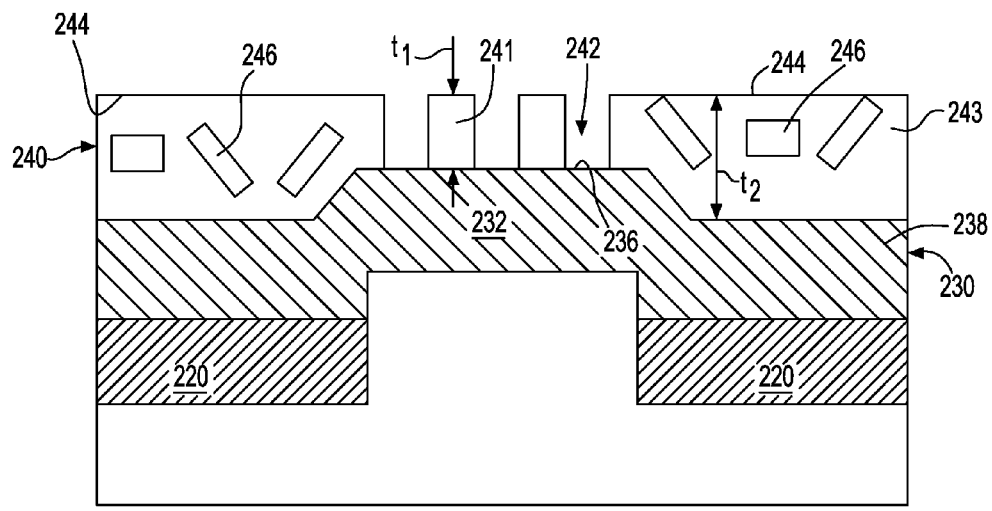
FIG. 6 is a sectional view illustrating a stage in a method of fabricating a microelectronic element subsequent to the stage illustrated in FIG. 5, in accordance with an embodiment of the invention.

It is not intended to limit the applicability of the embodiments of the invention herein to a particular process or processes, other than as specifically provided herein. Thus, any one of the processes available can be used to form copper lines having exposed surfaces which are disposed below a height of an exposed surface of a dielectric layer, without limiting the embodiments herein to a particular method of forming such structure. Then, as seen in FIG. 5, a dielectric cap layer 230 is formed to overlie the metal lines 220 and dielectric layer 210. The dielectric cap layer typically includes a material such as silicon carbide, silicon nitride, silicon carbon nitride, or a combination thereof. The dielectric cap layer 230 can be deposited conformally over the structure such that the topography of the cap layer 230 follows the topography of the underlying recessed copper lines 220 and the dielectric layer 210 between the copper lines. In one example, the dielectric cap layer can be formed by plasma enhanced chemical vapor deposition (PECVD). As a result, the cap layer has a first portion 238 which overlies the metal lines 220, the first portion reaching a height H1 from the underlying dielectric layer 210. A second portion 232 overlies the portion of the dielectric layer 210 between the metal lines 220 and extends a height H2 above a height of the exposed surface 214' of the dielectric layer 210. As seen in FIG. 5, the first portion 238 does not extend as high (H1) above the exposed surface 214' of the dielectric layer as the second portion 232 extends above (H2) the exposed surface 214'. In one embodiment, the difference between the heights H1, H2 of the first and second portions of the cap layer can be greater than 100 angstroms. In one example, the difference in the heights H1, H2 is greater than 200 angstroms. In a particular embodiment, the difference between the heights H1, H2 of the cap layer above the exposed surface 214' does not exceed 25% of the original thickness T of the metal lines 220. Subsequently, as illustrated in FIG. 6, a liquid material is deposited over the cap layer 230 to form a mask 240 thereon. The material can be a self-planarizing material and can be deposited onto the cap layer in liquid form. Any suitable technique can be used to deposit the material, such as a spin-on or spray-on technique, among others. The liquid material can be a di-block material, for example. A di-block material belongs to a class of block copolymers which have self-assembling properties. A di-block material includes two distinct homopolymer blocks which are linked by a covalent bond. Other block copolymers can include greater numbers of distinct homopolymer blocks. For example, a tri-block material includes three distinct homopolymer blocks and multi-block copolymers include more than three distinct homopolymer blocks.

As seen in FIG. 6, a di-block mask 240 can be formed by depositing a di-block material which includes the distinct homopolymer blocks of polystyrene and poly (methyl methacrylate)("PMMA") over the cap layer 230. The di-block material can form a self-assembled layer having a first portion 241 having a first thickness $t_1$ overlying portion 232 of the cap layer, and a second portion 243 having a second thickness $t_2$ overlying portion 238 of the cap layer. Since the di-block layer can have self-planarizing characteristics, the exposed surface 244 of the di-block layer can be at least substantially planar. A difference between the thicknesses t1 and t2 of the first and second portions of the di-block layer can be determined by the difference in the heights H1, H2 (FIG. 5) of the first and second portions 238, 232 of the cap layer from a height of a surface 214' of the dielectric layer.

In second portion 243, where the deposited di-block material is thicker than a critical thickness of the particular di-block material, one of the di-block components, PMMA, can appear as a plurality of regions in locations 246 which are oriented in random directions relative to the other di-block component, polystyrene, in which locations 246 are disposed. These locations 246 are protected from a subsequent etch process used to clear the PMMA from within exposed locations 242. In first portion 241, the first thickness $t_1$ of the di-block material as deposited can be thinner than a critical thickness of the particular di-block material. In that case, the properties of the di-block material cause the PMMA regions at locations where holes 242 will be formed to be oriented in a direction normal to a major surface of the underlying second portion 232 of the cap layer. The PMMA regions at locations where holes 242 will be formed can then be removed using an etchant that selectively etches the PMMA regions while not attacking the polystyrene material adjacent to the PMMA regions. For example, an etch chemistry using $CF_4$ and $O_2$ can be used to remove the PMMA regions which are exposed to the etchant, so as to form a multiplicity of holes 242 overlying second portion 232 of the cap layer. The holes 242 can be located at randomly disposed locations; however, the holes 242 typically are oriented in a direction normal to the surface 236 of second portion 232 of the cap layer. As seen in FIG. 6, the holes 242 can be open at an exposed surface 244 of the di-block mask 240 and can extend downwardly towards the dielectric cap layer. The holes 242 may also expose a surface 236 of the cap layer underlying the di-block mask 240. Second portions 243 of the di-block layer overlie the first portions 238 of the cap layer 230.

Figure 7:
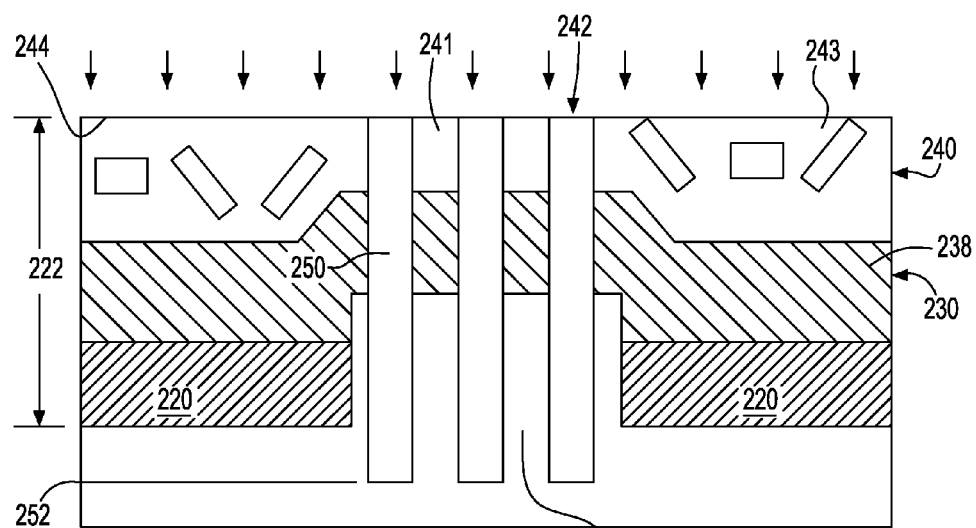
FIG. 7 is a sectional view illustrating a stage in a method of fabricating a microelectronic element subsequent to the stage illustrated in FIG. 6, in accordance with an embodiment of the invention.

As seen in FIG. 7, subsequently, the structure is subjected to a directional etch process such as a reactive ion etch ("RIE"). The di-block mask 240 functions as an etch mask during this process. As a result, RIE etches holes in the second portion of the cap layer 230 and the underlying dielectric layer 210 in alignment with the holes 242 in first portion 241 of the di-block layer. As shown in FIG. 7, RIE can etch holes 250 within the dielectric layer 210 to a depth 252 from the exposed surface 244 which is lower than a maximum depth 222 of the metal lines 220. During the RIE process, the exposed surface 244 can be eroded somewhat from the ion bombardment thereof. However, during RIE, the second portions 243 of the di-block mask 240 protect the first portions 238 of the cap layer 230 from being attacked by the etchant, in this way protecting the underlying metal lines 220 as well.

Figure 8:
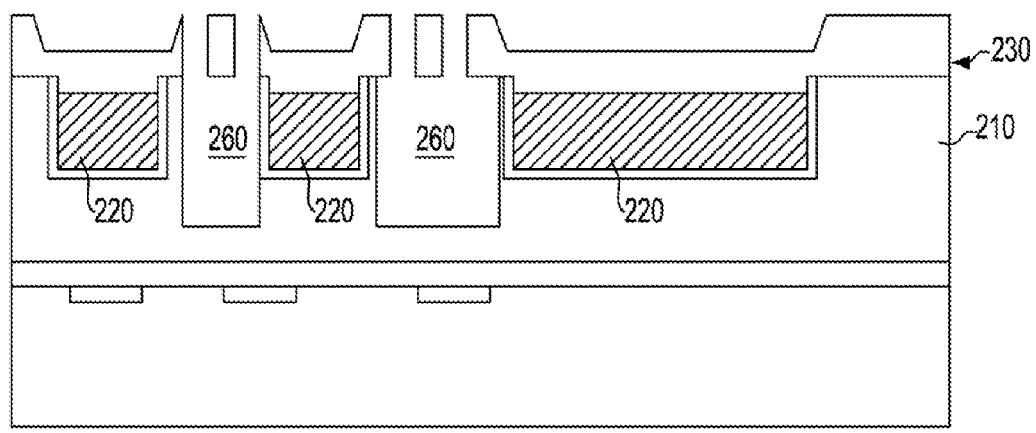
FIG. 8 is a sectional view illustrating a stage in a method of fabricating a microelectronic element subsequent to the stage illustrated in FIG. 7, in accordance with an embodiment of the invention.

FIG. 8 is a sectional view which illustrates a subsequent stage of fabrication, the view showing additional features similar to those described with reference to FIG. 4 above. In the view provided in FIG. 8, an additional metal line 220 is shown and the holes in the cap layer are illustrated differently, but the same concepts as described above apply. As seen in FIG. 8, the di-block mask 240 subsequently can be removed and the holes in the dielectric layer 210 can be enlarged selectively with respect to the material of the dielectric cap layer 230. In this way, the holes can be enlarged into cavities 260 which underlie the cap layer 230 between the metal lines 220.

The cavities can function as "air gaps", i.e., as voids filled with air, inert gas or other gas such as nitrogen which is not excessively reactive with respect to a metal of which the metal lines essentially consist. The air gaps tend to reduce unwanted, i.e., "parasitic" capacitance between adjacent metal lines within the chip. The unwanted capacitance can be reduced because capacitance "C" is directly proportional to the relative permittivity "k" (a constant) of a dielectric material disposed between the two plates of a capacitor separated by a distance "d" in accordance with the equation:

$$C = k \in_0 A/d$$

and the relative permittivity constant "k" of the air or other gas is close to unity. The permittivity of the air or gas contained within the air gaps can be quite a bit lower than the permittivity of most solid dielectric materials such as those used as interlevel dielectric layers of semiconductor elements.

Figure 9:
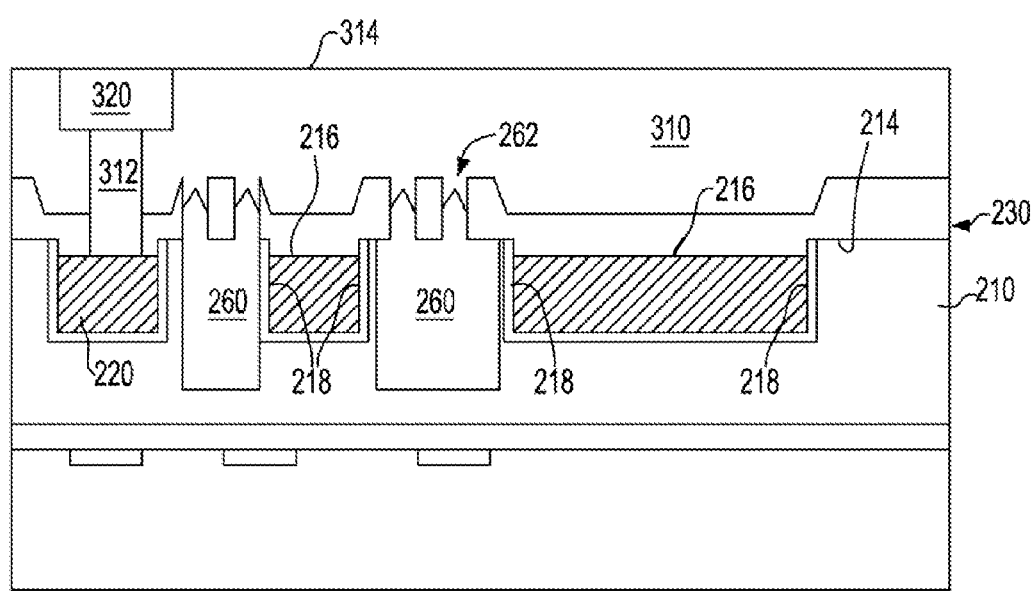
FIG. 9 is a sectional view illustrating a stage in a method of fabricating a microelectronic element subsequent to the stage illustrated in FIG. 8, in accordance with an embodiment of the invention.

Subsequently seen in FIG. 9, an additional dielectric layer 310 such as an ILD layer can be deposited over the structure. The additional dielectric layer can consist essentially of SiCOH or a low-K dielectric material, for example. Process parameters can be selected such that the deposited dielectric material pinches off the entrances 262 to the holes in the cap layer 230 soon after the start of deposition. Stated another way, the dielectric material is deposited in a way that it accumulates on inner walls of the entrances 262 to the holes in the cap layer 230 such that the deposited dielectric material closes the entrances within such holes before much material is deposited within the cavities 260. As a result, comparatively little dielectric material can be deposited within the cavities 260. After forming the dielectric layer 310, further conductive interconnection can be provided to higher level metal lines of the microelectronic element, such as by fabricating a through via 312 and a further metal feature or metal line 320 exposed at a surface 314 of the additional dielectric layer 310. The structure seen in FIG. 9 then can have metal lines 220 each of which has but a single surface 216 extending between edges 218 of each metal line 220. The surfaces 216 of the metal lines can be coplanar with the top surface 214 of the dielectric layer 210.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating a microelectronic element having an air gap in a dielectric layer thereof, comprising:
   a) forming a cap layer having a first portion overlying surfaces of metal lines and a second portion overlying a surface of a dielectric layer in which the metal lines are disposed, the first portion having a first height above the surface of the dielectric layer, and the second portion having a second height above the surface of the dielectric layer, the second height being greater than the first height;
   b) after step (a), forming a mask over the cap layer, the mask having a multiplicity of randomly disposed holes, each exposing a surface of only the second portion of the cap layer, the mask fully covering a surface of the first portion of the cap layer; and
   c) after step (b), directing an etchant towards the first and second portions of the cap layer to form holes in the cap layer aligned with the holes in the mask, and to remove material from the dielectric layer where exposed to the etchant by the holes in the cap layer, wherein the mask protects the first portion of the cap layer from being attacked by the etchant.

2. A method as claimed in claim 1, further comprising forming the dielectric layer and the metal lines so that the surfaces of the metal lines are disposed below the surface of the dielectric layer.

3. A method as claimed in claim 1, wherein the mask and the cap layer overlying the metal lines protect the metal lines from being attacked by the etchant.

4. A method as claimed in claim 3, wherein the metal lines consist essentially of copper.

5. A method as claimed in claim 1, wherein step (b) includes self-assembling the mask having the multiplicity of randomly disposed holes from a block copolymer material.

6. A method as claimed in claim 5, wherein the mask formed in step (b) is a di-block layer, the di-block layer having a self-planarizing property such that the di-block layer has a second thickness over the first portion of the cap layer and has a first thickness over the second portion of the cap layer, wherein the first thickness is less than the second thickness.

7. A method as claimed in claim 6, wherein the di-block layer comprises polystyrene and poly (methyl methacrylate) ("PMMA").

8. A method as claimed in claim 7, wherein the first thickness is less than a critical thickness such that the multiplicity of holes are disposed in areas where the di-block layer has the first thickness.

9. A method as claimed in claim 8, wherein the second thickness is greater than the critical thickness such that the areas of the di-block layer having the second thickness are at least substantially free of the randomly disposed holes.

10. A method as claimed in claim 9, wherein the etchant is a first etchant, the method further comprising directing a second etchant into the holes in the cap layer and into the holes in the underlying dielectric layer to form cavities in the dielectric layer.

11. A method as claimed in claim 1, wherein the dielectric layer includes at least one of SiCOH or a low-K dielectric.

12. A method as claimed in claim 1, wherein the cap layer includes at least one of silicon carbide, silicon nitride, or a combination of silicon carbide and silicon nitride.

13. A method of forming an air gap in a dielectric layer, comprising:
   a) depositing a dielectric cap layer over surfaces of metal lines and over a surface of a dielectric layer in which the metal lines are disposed, the cap layer having a first portion overlying the surfaces of the metal lines and a second portion overlying the surface of the dielectric layer between the metal lines, wherein the first portion has a first height above the surface of the dielectric layer, and the second portion has a second height above the surface of the dielectric layer, the second height being greater than the first height;
   b) forming a di-block layer overlying the cap layer, the di-block layer having a substantially planar surface remote from the cap layer, such that the di-block layer has a second portion overlying the first portion of the cap layer and a first portion overlying the second portion of the cap layer, wherein the second portion of the di-block layer has a thickness greater than or equal to a critical thickness of the di-block layer, and the first portion of the di-block layer has a thickness less than a critical thickness of the di-block layer, such that holes form preferentially in the first portion of the di-block layer which extend to a surface of the cap layer; and
   c) using the di-block layer as a mask, directing an etchant towards the first and second portions of the cap layer to form holes in the cap layer aligned with the holes in the first portion of the di-block layer, and to remove material from the dielectric layer to create holes in the dielectric layer where exposed thereto by the holes in the cap layer, wherein the di-block layer protects the first portion of the cap layer and the metal lines underlying the first portion of the cap layer from being attacked by the etchant.

14. A method as claimed in claim 13, further comprising forming the dielectric layer and the metal lines so that the surfaces of the metal lines are disposed below the surface of the dielectric layer.

15. A method as claimed in claim 13, wherein the di-block layer comprises polystyrene and poly (methyl methacrylate) ("PMMA").

16. A method as claimed in claim 13, wherein the etchant is a first etchant, the method further comprising directing a second etchant through the holes in the cap layer and into the holes in the dielectric layer so as to enlarge the holes in the dielectric layer.

* * * * *